(12) United States Patent
Lee et al.

(10) Patent No.: US 10,851,266 B2
(45) Date of Patent: Dec. 1, 2020

(54) SLURRY COMPOSITION FOR POLISHING AND METHOD FOR POLISHING SEMICONDUCTOR THIN FILM WITH STEPS OF A HIGH ASPECT RATIO

(71) Applicant: SOULBRAIN CO., LTD., Seongnam-si (KR)

(72) Inventors: Jeong Ho Lee, Seongnam-si (KR); Seok Joo Kim, Seongnam-si (KR)

( * ) Notice: Subject to any disclaimer, the term of this patent is extended or adjusted under 35 U.S.C. 154(b) by 0 days.

(21) Appl. No.: 16/191,471

(22) Filed: Nov. 15, 2018

(65) Prior Publication Data

US 2019/0161644 A1 May 30, 2019

(30) Foreign Application Priority Data

Nov. 30, 2017 (KR) .................. 10-2017-0163770

(51) Int. Cl.
  *C09G 1/02* (2006.01)
  *H01L 21/306* (2006.01)
  *H01L 21/3105* (2006.01)

(52) U.S. Cl.
  CPC .......... *C09G 1/02* (2013.01); *H01L 21/30625* (2013.01); *H01L 21/31053* (2013.01)

(58) Field of Classification Search
  None
  See application file for complete search history.

(56) References Cited

U.S. PATENT DOCUMENTS 6,500,886 B1 * 12/2002 Yamamuro ............... C25D 3/22
  205/244
6,547,843 B2 * 4/2003 Shimazu .................. C09G 1/02
  51/309

(Continued)

FOREIGN PATENT DOCUMENTS

KR  1020060019257 A    3/2006
KR    20160079328 A  *  7/2016

*Primary Examiner* — Allan W. Olsen
(74) *Attorney, Agent, or Firm* — Jongkook Park

(57) ABSTRACT

The present invention relates to a slurry composition for polishing and a method for polishing a semiconductor thin film with steps of a high aspect ratio, and more particularly, by comprising polishing particles, a compound represented by Chemical Formula 1 below, and a compound represented by Chemical Formula 2 below, to make a slurry composition for polishing that has a high polishing speed in high stepped regions while simultaneously protecting low stepped regions to obtain a high degree of flatness without leaving remaining steps after the completion of polishing, and a method for polishing a semiconductor thin film with steps of a high aspect ratio.

[Chemical Formula 1]

$$HO-CH_2-(CH)_n-\overset{O}{\overset{\|}{C}}-OH$$
$$\phantom{HO-CH_2-(}\overset{|}{OH}$$

in Chemical Formula 1, n is an integer of 1 to 10,

[Chemical Formula 2]

$$R_1-\underset{\underset{R_2}{|}}{N}-(CH_2)_m-\underset{\underset{}{|}}{\overset{R_3}{N}}-R_4$$

in Chemical Formula 2, $R_1$ to $R_4$ are independently C1-C10 alkyl groups, and m is an integer of 1 to 10.

13 Claims, 1 Drawing Sheet

(56) References Cited

U.S. PATENT DOCUMENTS

| | | | |
|---|---|---|---|
| 6,740,589 B2* | 5/2004 | Shimazu | C09G 1/02 257/E21.304 |
| 9,437,446 B2* | 9/2016 | Kato | H01L 21/31053 |
| 2002/0081949 A1* | 6/2002 | Yoshida | C09G 1/02 451/41 |
| 2010/0015807 A1* | 1/2010 | Kim | C09G 1/02 438/693 |
| 2011/0045741 A1* | 2/2011 | Ahn | C09G 1/02 451/28 |
| 2011/0130077 A1* | 6/2011 | Litke | B24B 37/24 451/41 |
| 2013/0150239 A1* | 6/2013 | Premachandran | A01N 43/80 504/116.1 |
| 2014/0154884 A1* | 6/2014 | Kato | H01L 21/31053 438/693 |
| 2014/0374378 A1* | 12/2014 | Shi | B24B 1/00 216/38 |
| 2015/0218418 A1* | 8/2015 | Yamate | C08L 83/04 525/479 |
| 2015/0344738 A1* | 12/2015 | Onishi | C09G 1/02 438/692 |
| 2018/0362806 A1* | 12/2018 | Park | H01L 21/31053 |
| 2019/0194493 A1* | 6/2019 | Yokoi | H01L 21/3212 |
| 2019/0316003 A1* | 10/2019 | Kim | C09G 1/02 |

* cited by examiner

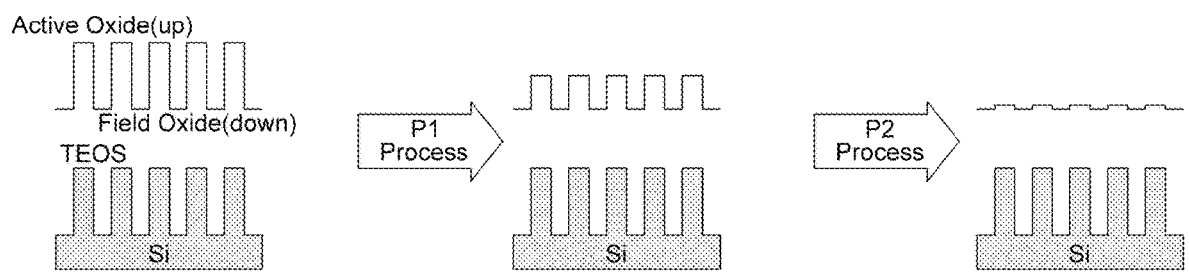

SLURRY COMPOSITION FOR POLISHING AND METHOD FOR POLISHING SEMICONDUCTOR THIN FILM WITH STEPS OF A HIGH ASPECT RATIO

CROSS-REFERENCE TO RELATED APPLICATIONS

This application claims priority under 35 U.S.C. § 119 to Korean Patent Application No. 10-2017-0163770, filed on Nov. 30, 2017, in the Korean Intellectual Property Office, the disclosure of which is incorporated herein by reference in its entirety.

TECHNICAL FIELD

The following disclosure relates to a slurry composition for polishing and a method for polishing a semiconductor thin film with steps of a high aspect ratio, and more particularly, to a slurry composition for polishing that has a high polishing speed in high stepped regions and which simultaneously protects low stepped regions to obtain a high degree of flatness without leaving remaining steps after the completion of polishing, and a method for polishing a semiconductor thin film with steps of a high aspect ratio.

BACKGROUND

As semiconductor devices become more diversified and highly integrated, finer pattern forming techniques are used, and thus the surface structure of semiconductor devices is becoming more complicated and the steps of surface films are also becoming larger. Recently, the chemical mechanical polishing (CMP) process has been used as a planarization technique for removing the steps in a specific film formed on a substrate in the manufacture of a semiconductor device.

In the CMP process, the polishing speed, degree of flatness of a polishing surface, and degree of occurrence of scratches are important, and the CMP process is determined by CMP the process conditions, the type of slurry, the type of polishing pad employed, and the like.

In general, regions with small patterns and high density are locally planarized, and regions with large patterns and large area reflect the initial steps as they are. Eventually, since the steps cannot be completely removed from a pattern with high stepped regions and low stepped regions, there will be remaining steps even after polishing, thus lowering the planarization efficiency.

As described above, in the related art, a polishing target is polished for a time under single conditions with a single slurry during a polishing process, and thus there are problems not only in that the polishing cost is increased due to an increase in the amount of slurry consumption, but also in that there are remaining steps which are not removed from the high stepped regions and low stepped regions and are therefore present even after the polishing is completed, which in turn makes subsequent processes difficult and reduces the yield of semiconductor devices.

Patent Literature: KR 2006-0019257

SUMMARY

An embodiment of the present invention is directed to providing a slurry composition for polishing that has a high polishing speed in high stepped regions and which simultaneously protects low stepped regions to obtain a high degree of flatness without leaving remaining steps after the completion of polishing, and a method for polishing a semiconductor thin film with steps of a high aspect ratio.

All of the above objects and other objects of the present invention can be achieved by the present invention described below.

The present invention provides a slurry composition for polishing, comprising a) polishing particles; b) a compound represented by Chemical Formula 1 below; and c) a compound represented by Chemical Formula 2 below.

In addition, the present invention provides a slurry composition for polishing, comprising i) a polishing particle dispersion at a concentration of 3 to 5 wt %; and ii) an additive mixture solution at a concentration of 0.3 to 1.5 wt %; wherein the additive mixture solution in ii) includes a compound represented by Chemical Formula 1 below and a compound represented by Chemical Formula 2 below.

[Chemical Formula 1]

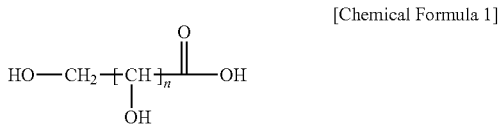

(Wherein n is an integer of 1 to 10)

[Chemical Formula 2]

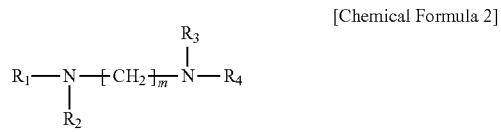

(Wherein $R_1$ to $R_4$ are independently C1-C10 alkyl groups, and m is an integer of 1 to 10)

In addition, the present invention provides a method for polishing a semiconductor thin film using the slurry composition for polishing, in which the method is characterized in two steps comprising: a primary polishing step with a slurry composition for polishing in which the volume ratio of the polishing particle dispersion in i) and the additive mixture solution in ii) is from 1:1 to 1:3; and a secondary polishing step using a slurry composition for polishing in which the volume ratio of the polishing particle dispersion in i) and the additive mixture solution in ii) is from 1:4 to 1:10.

BRIEF DESCRIPTION OF THE DRAWINGS

FIG. 1 schematically shows a polishing process of a semiconductor thin film with steps of a high aspect ratio using a slurry composition of the present invention for polishing.

DETAILED DESCRIPTION OF EMBODIMENTS

Hereinafter, a slurry composition for polishing and a method for polishing a semiconductor thin film with steps of a high aspect ratio, according to the present invention, will be described in detail.

The present inventors found that a slurry composition for polishing including both a predetermined hydroxycarboxylic acid compound and a predetermined diamine compound at the same time had a high polishing speed in high stepped regions while simultaneously protecting low stepped regions to obtain a high degree of flatness without leaving remaining steps after the completion of polishing, thus becoming devoted to the study based on this finding, and thereby completing the present invention.

The slurry composition for polishing of the present invention may be characterized by inclusion of: a) polishing particles; b) a compound represented by Chemical Formula 1 below; and c) a compound represented by Chemical Formula 2 below. In this case, there are effects of having a high polishing speed in high stepped regions while simultaneously protecting low stepped regions to obtain a high degree of flatness without leaving remaining steps after the completion of polishing.

As another example, the slurry composition for polishing of the present invention may be characterized by including i) a polishing particle dispersion at a concentration of 3 to 5 wt %; and ii) an additive mixture solution at a concentration of 0.3 to 1.5 wt %, wherein the additive mixture solution in ii) includes a compound represented by Chemical Formula 1 below and a compound represented by Chemical Formula 2 below. In this case, there are effects of having a high polishing speed in high stepped regions while simultaneously protecting low stepped regions to obtain a high degree of flatness without leaving remaining steps after the completion of polishing.

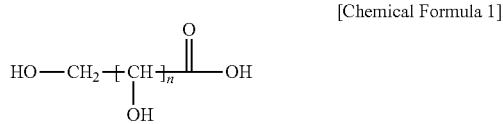

[Chemical Formula 1]

In Chemical Formula 1, n is an integer of 1 to 10,

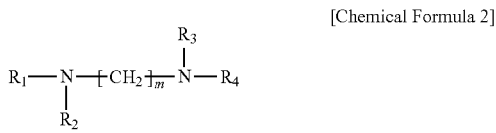

[Chemical Formula 2]

In Chemical Formula 2, $R_1$ to $R_4$ are independently C1-C10 alkyl groups, and m is an integer of 1 to 10.

Hereinafter, each component of the slurry composition for polishing of the present invention will be described in detail.

a) Polishing Particles

The polishing particles are not particularly limited, and for example, may be polishing particles used in a conventional slurry composition. However, as a specific example, the polishing particles may be one or more selected from the group consisting of metal oxide particles, organic particles, and organic-inorganic composite particles.

The metal oxide particles may be, for example, one or more selected from the group consisting of cerium oxide particles, silica particles, alumina particles, zirconia particles, titania particles, and zeolite particles, but more preferably cerium oxide particles. In this case, there is an effect of significantly improving the polishing rate while reducing the occurrence of scratches of a polishing target film.

The organic particles may be, for example, one or more selected from the group consisting of styrene-based polymer particles, acrylic polymer particles, polyvinyl chloride particles, polyamide particles, polycarbonate particles, and polyimide particles.

The organic-inorganic composite particles may be, for example, formed by combining an organic material and an inorganic material.

The meaning of 'composite' in the present description is not different from the meaning of 'composite' used in the technical field to which the present invention pertains, and for example, may mean that two or more kinds of materials are physically bonded.

The polishing particles may be included in an amount of, for example, 0.1 to 10 wt %, 0.1 to 5 wt %, or 0.2 to 1 wt % based on the slurry composition for polishing. Within this range, there is an effect of having excellent dispersion stability and an excellent polishing rate.

The polishing particles may have a primary particle size of, for example, 10 to 90 nm, 20 to 80 nm, or 30 to 60 nm. Within this range, there are effects of having an excellent polishing rate, and reducing the occurrence of scratches of the polishing target film even when the slurry composition for polishing is applied to a semiconductor process having a narrow line width.

The polishing particles may be included in an amount of, for example, 70 to 95 wt % or 75 to 92 wt % based on a total of 100 wt % of a) polishing particles, b) a hydroxycarboxylic acid compound, and c) a diamine compound. Within this range, there is an effect of having excellent dispersion stability and an excellent polishing rate.

In the present description, primary particle refers to an individual particle (crystal) of cerium oxide grown in a calcination step. The primary particle size may be measured using SEM or TEM, and specifically, is determined as an average value obtained by measuring the sizes of 500 to 1000 particles shown on one screen using a program tool which measures the particle size in SEM or TEM.

The polishing particles may have a secondary particle size of, for example, 120 to 250 nm, or 150 to 250 nm. Within this range, there is an effect of having excellent dispersion stability and an excellent polishing rate.

In the present description, the secondary particles are a group of particles in the form of aggregates, and may mean particles formed by aggregation of the primary particles. The secondary particle size can be measured using a laser diffraction particle size analyzer.

b) Hydroxycarboxylic Acid Compound

The hydroxycarboxylic acid compound of the present invention may be represented by Chemical Formula 1 below. In this case, there is an effect of having excellent polishing speed, and obtaining a high degree of flatness without remaining steps after the completion of polishing.

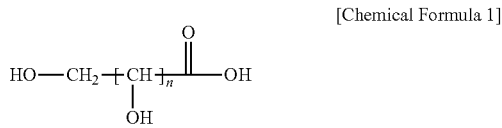

[Chemical Formula 1]

In Chemical Formula 1, n is an integer of 1 to 10.

In Chemical Formula 1 above, n may be, for example, 1 to 10, 3 to 5, or 6 to 8. Within this range, there is an effect of having an excellent polishing speed and obtaining a high degree of flatness without leaving remaining steps after the completion of polishing.

As a specific example, the compound of b), represented by Chemical Formula 1, may be one or more selected from the group consisting of gluconic acid, glucuronic acid, glycolic acid, glucaric acid, and sodium gluconate. In this case, there is an effect of having excellent polishing speed and obtaining a high degree of flatness without leaving remaining steps after the completion of polishing.

The compound of b), represented by Chemical Formula 1, may be included in an amount of, for example, 0.01 to 1.0 wt %, 0.05 to 0.5 wt %, or 0.1 to 0.5 wt % based on the slurry composition for polishing. Within this range, there is an effect of having excellent polishing speed, and obtaining a high degree of flatness without leaving remaining steps after the completion of polishing.

The compound of b), represented by Chemical Formula 1, may be included in an amount of, for example, 3 to 15 wt % or 4 to 11 wt % based on a total of 100 wt % of a) polishing particles, b) the hydroxycarboxylic acid compound, and c) a diamine compound. Within this range, there is an effect of achieving excellent polishing speed and an excellent degree of flatness.

c) Diamine Compound

The diamine compound of the present description may be represented by Chemical Formula 2 below. In this case, there is an effect of appropriately controlling the hydrophilicity and hydrophobicity to reduce dishing and corrosion of the polishing target film.

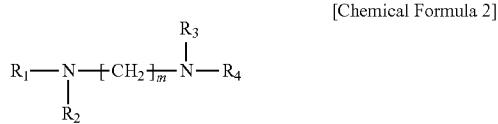

[Chemical Formula 2]

In Chemical Formula 2, $R_1$ to $R_4$ are independently C1-C10 alkyl groups, and m is an integer of 1 to 10.

In Chemical Formula 2, m may be, for example, 1 to 10, 1 to 6, or 2 to 4. Within this range, there is an effect of reducing dishing and corrosion of a polishing target film.

In Chemical Formula 2 above, $R_1$ to $R_4$ may be, for example, independently, a C1-C10 alkyl group, a C1-C5 alkyl group, or a C1-C2 alkyl group. Within this range, there is an effect of reducing dishing and corrosion of a polishing target film.

The compound of c), represented by Chemical Formula 2, may be, for example, one or more selected from the group consisting of an organic amine compound, a salt thereof, and a mixture thereof, preferably being a diamine compound, and more preferably tetramethyl propylene diamine (TMPDA). In this case, there is an effect of reducing dishing and corrosion of a polishing target film by appropriately controlling the hydrophilicity and hydrophobicity.

The compound of c), represented by Chemical Formula 2, may be included in an amount of, for example, 0.01 to 1.0 wt %, 0.05 to 0.5 wt %, or 0.1 to 0.5 wt % based on the slurry composition for polishing. Within this range, there is an effect of reducing dishing and corrosion of a polishing target film.

The compound of c), represented by Chemical Formula 2, may be included in an amount of, for example, 3 to 15 wt % or 4 to 11 wt % based on a total of 100 wt % of a) polishing particles, b) hydroxycarboxylic acid compound, and c) the diamine compound. Within this range, there is a great effect of reducing dishing and corrosion of a polishing target film.

A weight ratio of the compound represented by Chemical Formula 1 and the compound represented by Chemical Formula 2 may be, for example, 10:1 to 1:10, or 5:1 to 1:5, and more preferably 2:1 to 1:2, 1.5:1 to 1:1.5, or 1.2:1 to 1:1.2. Within this range, there are effects of having a high polishing speed in the high stepped regions while simultaneously protecting the low stepped regions to obtain a high degree of flatness without leaving remaining steps after the completion of polishing.

The slurry composition for polishing, according to the present invention, may further include, for example, d) an anionic polymer and/or e) deionized water. In this case, there are effects of having a high polishing speed in the high stepped regions while simultaneously protecting the low stepped regions to obtain a high degree of flatness without leaving remaining steps after the completion of polishing.

d) Anionic Polymer

A surface charge of the slurry composition for polishing may be, for example, negative. In this case, there are effects of having excellent dispersion stability, while also reducing the dishing, corrosion, and scratching of the polishing target film.

The slurry composition for polishing may include, for example, an anionic polymer. In this case, there are effects of having excellent dispersion stability, while reducing the dishing, corrosion, and scratching of the polishing target film.

Examples of the anionic polymer may include polyacrylic acid, polymethacrylic acid, polyacrylic maleic acid, polystyrene sulfate, polyphosphoric acid, polyglutamic acid, polyphosphate, polyhexane, polyaspartic acid, polysodium styrenesulfonate, polyvinylsulfonic acid, polysodium salt, polyamino acid, polyvinylphosphonic acid, poly asphaltic acid, and polyanethol sulfonic acid. In this case, there are effects of having excellent dispersion stability, and reducing dishing, corrosion, and scratching of the polishing target film.

The anionic polymer may be included in an amount of, for example, 0.1 to 5.0 wt %, 0.1 to 3.0 wt %, or 0.1 to 1.0 wt % based on the slurry composition for polishing (a+b+c+d+e). Within this range, there are effects of having excellent dispersion stability, while reducing the dishing, corrosion, and scratching of the polishing target film, and having an excellent polishing rate.

e) Deionized Water

Deionized water may be included in an amount of, for example, 85 to 99.9 wt % or 95 to 99.9 wt % based on the slurry composition for polishing (a+b+c+d+e). Within this range, particle dispersibility may be excellent and a stable polishing effect may be exhibited.

i) Polishing Particle Dispersion

The polishing particle dispersion of i) may have, for example, a concentration of 3 to 5 wt % or 4 to 5 wt %. Within this range, there are effects of having a high polishing speed in high stepped regions while simultaneously protecting low stepped regions to obtain a high degree of flatness without leaving remaining steps after the completion of polishing.

In the present description, the concentration indicates a concentration by wt %, and refers to a percentage (%) ratio of the total weight of corresponding particles with respect to the total weight of a solution.

The polishing particle dispersion of i) may include, for example, polishing particles, deionized water, and dispersant. In this case, there are effects of having a high polishing speed in the high stepped regions while simultaneously protecting the low stepped regions to obtain a high degree of flatness without leaving remaining steps after the completion of polishing.

In the polishing particle dispersion of i), the polishing particles may be, for example, the above-described polishing particles in a). In this case, there are effects of having an excellent polishing rate, and reducing the occurrence of scratches of the polishing target film, even when the slurry composition for polishing is applied to a semiconductor process having a narrow line width.

In the polishing particle dispersion of i), the deionized water is not particularly limited if it is commonly used in the technical field of the present invention.

In the polishing particle dispersion of i), the dispersant is not particularly limited if it is a dispersant used in a conventional polishing particle dispersion. However, as an example, the dispersant may be one or more selected from the group consisting of polyvinyl alcohol, ethylene glycol, glycerin, polyethylene glycol, polyacrylic acid, polyacrylic acid ammonium salt, polyacrylic maleic acid, non-ionic dispersant, and an anionic dispersant. In this case, there are effects of preventing precipitation or deterioration of the slurry composition and enhancing dispersibility.

The pH of the polishing particle dispersion of i) may be, for example, 7 to 10 or 8 to 9. Within this range, there is an effect of preventing precipitation or deterioration of the slurry composition to improve the stability of the slurry composition.

In the present specification, the pH can be measured using a general pH measuring apparatus at room temperature, unless otherwise specified.

ii) Additive Mixture Solution

The additive mixture solution of ii) may have a concentration of 0.3 to 1.5 wt %, 0.5 to 1.2 wt %, or 0.8 to 1.2 wt %. Within this range, there are effects of having a high polishing speed in high stepped regions while simultaneously protecting low stepped regions to achieve a high degree of flatness without leaving remaining steps after the completion of polishing.

The additive mixture solution of ii) may include, for example, both b), the compound represented by Chemical Formula 1, and c), the compound represented by Chemical Formula 2 described above. In this case, there are effects of having a high polishing speed while reducing the dishing and corrosion of the polishing target film to obtain a high degree of flatness without leaving remaining steps after the completion of polishing.

The additive mixture solution of ii) may further include an anionic polymer, a stabilizer, and a pH adjuster. In this case, there is an effect of improving the stability of a polishing agent.

In the additive mixture solution, ii), the anionic polymer may be, for example, the anionic polymer of d) described above. In this case, there are effects of having excellent dispersion stability and reducing the dishing, corrosion, and scratching of the polishing target film.

In the additive mixture solution of ii), the stabilizer may be any stabilizer without limitation if it is used in this technical field, but more preferably, polyethylene glycol. In this case, there are effects of having an excellent polishing rate and maintaining the polishing performance for a long period of time.

In the additive mixture solution of ii), the pH adjuster may be one or more selected from the group consisting of, for example, ammonia water, sodium hydroxide, potassium hydroxide, ammonium hydroxide, sodium carbonate, potassium carbonate, sulfuric acid, hydrochloric acid, nitric acid, phosphoric acid, citric acid, ammonia, potassium phosphate, and ammonium chloride. In this case, there is an effect of preventing precipitation or deterioration of the polishing agent by adjusting the pH within a desired range, such that the stability of the polishing agent may be improved.

The pH of the additive mixture solution of ii) may be, for example, 4 to 8 or 5 to 7. Within this range, there is an effect of preventing precipitation or deterioration of the slurry composition to improve the stability of the slurry composition.

The additive mixture solution, ii), may further include one or more additive selected from the group consisting of a preservative and a lubricant, within a range in which the physical properties are not affected.

The preservative may be, for example, an isothiazole-based compound.

The lubricant may be one or more selected from the group consisting of glycerin, ethylene glycol, and propylene glycol. In this case, there is an effect of having excellent dispersion stability.

A volume ratio of the polishing particle dispersion, i), and the additive mixture solution, ii), may be, for example, 1:1 to 1:10, 1:1.5 to 1:8, or 1:2 to 1:6. Within this range, there is an effect of having an excellent polishing speed while reducing the dishing and corrosion of the polishing target film to obtain a high degree of flatness without leaving remaining steps after the completion of polishing.

Slurry Composition for Polishing

The slurry composition for polishing may be used to polish semiconductor thin films with steps of a high aspect ratio, for example, for semiconductors of 32 or more layers, 36 or more layers, 64 or more layers, or 64 to 128 layers. Within this range, the effects of the present invention are clearly shown.

Method for Polishing Semiconductor Thin Film with Steps of a High Aspect Ratio

A method for polishing a semiconductor thin film of the present description may include polishing semiconductor thin films with steps of a high aspect ratio for semiconductors with 32 or more layers, 36 or more layers, 64 or more layers, or 64 to 128 layers, using the slurry composition for polishing. In this case, there is an effect of having an excellent polishing speed and an excellent degree of flatness.

As another example, a method for polishing a semiconductor thin film of the present description, which is a method for polishing semiconductor thin films with steps of a high aspect ratio using the slurry composition for polishing of the present description, may include a primary-polishing step with a slurry composition for polishing in which a volume ratio of the i) polishing particle dispersion and the ii) additive mixture solution is 1:1 to 1:3; and a secondary-polishing step with a slurry composition for polishing in which a volume ratio of the i) polishing particle dispersion and the ii) additive mixture solution is 1:4 to 1:10. In this case, there are effects of having a high polishing speed in high stepped regions while simultaneously protecting low stepped regions to obtain a high degree of flatness without leaving remaining steps after the completion of polishing.

The method for polishing a semiconductor thin film with steps of a high aspect ratio may be, for example, a chemical mechanical polishing method in which the polishing target film on the substrate and a polishing pad are placed in a state in which they are in contact with each other and moved relatively in order to polish the polishing target film.

The primary-polishing step and the secondary-polishing step with the slurry composition for polishing are hereinafter referred to as a P1 process and a P2 process, respectively.

In the P1 and P2 processes, the polishing particle dispersion, i), may be, for example, the polishing particle dispersion described above, and the additive mixture solution, ii), may be, for example, the additive mixture solution described above. In this case, there are effects of having a high polishing speed in high stepped regions while simultaneously protecting low stepped regions to obtain a high degree of flatness without leaving remaining steps after the completion of polishing.

The P1 process may proceed, for example, to the point when the remaining step is 4,500 to 6,000 Å, or 5,000 to 6,000 Å, and specifically, may be performed using an auto stop function. In this case, there are effects of removing the high stepped regions at a high polishing speed while simultaneously protecting the low stepped regions, since the polishing particles and the pad are not in contact with the low stepped regions.

The method of the above-described auto stop is not particularly limited if it is a method commonly used in this technical field.

The P2 process may proceed, for example, from the point when the P1 process is terminated to the point when the remaining step is 0 Å. In this case, there are no remaining steps while protecting the low stepped regions.

In the P1 process, the volume ratio of the polishing particle dispersion and the additive mixture solution may be, for example, 1:1 to 1:3, 1:1.5 to 1:2.5, or 1:1.5 to 1:2. In this case, there are effects of having a high polishing speed in the high stepped regions while simultaneously protecting the low stepped regions.

In the P2 process, the volume ratio of the polishing particle dispersion and the additive mixture solution may be, for example, 1:4 to 1:10, 1:5 to 1:8, or 1:6 to 1:7. In this case, there are effects of protecting the low stepped regions and having a high degree of flatness without leaving remaining steps after the completion of polishing.

In the present invention, the removal rate of the step may be, for example, 9,000 Å/min or more, 12,000 Å/min or more, or 15,000 Å/min or more, and the removal amount of the field oxide may be, for example, 500 Å/min or less, 250 Å/or less, or 100 Å/min or less. In this case, there are effects of having a high polishing speed in the high stepped regions while simultaneously protecting the low stepped regions to obtain a high degree of flatness without leaving remaining steps after the completion of polishing.

In the present invention, the degree of flatness may be, for example, 50 Å or less, 5 to 50 Å, or 5 to 20 Å. Within this range, the desired effect of the present invention is exhibited.

Hereinafter, preferred embodiments of the present invention will be described in order to facilitate a better understanding of the present invention. However, it will be apparent to those skilled in the art that the following Examples are provided only to illustrate the present invention, and various changes and modifications can be made within the spirit and the scope of the invention. These variations and modifications are included within the scope of the appended claims.

EXAMPLE

Example 1

2,000 g of cerium carbonate hydrate was calcined in air at 750° C. for 4 hours to prepare 1,200 g of cerium oxide, which was then subjected to wet grinding together with 24 g of polyacrylic acid as a dispersant, 4,000 ml of deionized water, and 20 g of ammonia water as a pH adjuster, using a medium-stirring type mill, and classified to obtain a cerium oxide dispersion. The cerium oxide dispersion had a solid content of 4.5 wt % and an average particle size of 140 nm.

In addition, to prepare the additive mixture solution, 5 g of polyacrylic acid as an anionic polymer, 1 g of tetramethyl propylene diamine as a diamine compound, 1 g of gluconic acid as a hydroxycarboxylic acid compound, 1 g of glucose, and 0.1 g of polyethylene glycol as a stabilizer were added to 991.9 g of ultrapure water. The pH of the additive mixture solution was adjusted to 5.8 using ammonia.

Next, the prepared cerium oxide dispersion and the additive mixture solution were mixed at a volume ratio of 1:2 to prepare a slurry composition for polishing to be used in a P1 process, and at a ratio of 1:6 to prepare a slurry composition for polishing to be used in a P2 process.

Examples 2 to 3 and Comparative Examples 1 to 3

The same method as in Example 1 was performed, except that the components and contents of the additive mixture solution were used as described in Tables 1 and 2, respectively.

[P1 Composition]

TABLE 1

| | Volume ratio | | | Cerium oxide dispersion | | Additive mixture solution | | | | |
|---|---|---|---|---|---|---|---|---|---|---|
| | Cerium oxide dispersion | DIW | Additive mixture solution | Solid content | pH | Anoinic polymer | Hydroxycarboxylic acid compound | Diamine compound | Stabilizer | pH |
| Example 1 | 1 | 3 | 2 | 5.0 wt % | 8 | 0.5% | 0.1% | 0.1% | 0.01% | 5.8 |
| Example 2 | 1 | 3 | 2 | 5.0 wt % | 8 | 0.5% | 0.1% | 0.2% | 0.01% | 5.8 |
| Example 3 | 1 | 3 | 2 | 5.0 wt % | 8 | 0.5% | 0.2% | 0.1% | 0.01% | 5.8 |
| Comparative Example 1 | 1 | 3 | 2 | 5.0 wt % | 8 | 0.5% | — | 0.1% | 0.01% | 5.8 |
| Comparative Example 2 | 1 | 3 | 2 | 5.0 wt % | 8 | 0.5% | 0.1% | — | 0.01% | 5.8 |
| Comparative Example 3 | 1 | 3 | 2 | 5.0 wt % | 8 | 0.5% | — | — | 0.01% | 5.8 |

[P2 Composition]

TABLE 2

| | Volume ratio | | Cerium oxide dispersion | | Additive mixture solution | | | | |
| --- | --- | --- | --- | --- | --- | --- | --- | --- | --- |
| | Cerium oxide dispersion | DIW | Additive mixture solution | Solid content | pH | Anoinic polymer | Hydroxycarboxylic acid compound | Diamine compound | Stabilizer | pH |
| Example 1 | 1 | 3 | 6 | 5.0 wt % | 8 | 0.5% | 0.1% | 0.1% | 0.01% | 5.8 |
| Example 2 | 1 | 3 | 6 | 5.0 wt % | 8 | 0.5% | 0.1% | 0.2% | 0.01% | 5.8 |
| Example 3 | 1 | 3 | 6 | 5.0 wt % | 8 | 0.5% | 0.2% | 0.1% | 0.01% | 5.8 |
| Comparative Example 1 | 1 | 3 | 6 | 5.0 wt % | 8 | 0.5% | — | 0.1% | 0.01% | 5.8 |
| Comparative Example 2 | 1 | 3 | 6 | 5.0 wt % | 8 | 0.5% | 0.1% | — | 0.01% | 5.8 |
| Comparative Example 3 | 1 | 3 | 6 | 5.0 wt % | 8 | 0.5% | — | — | 0.01% | 5.8 |

[Polishing Conditions]
Polishing equipment: POLI 400 manufactured by GnP TECHNOLOGY INC.
Polishing target film: 4 cm×4 cm SKW 7-2 Pattern Wafer
Polishing pad: DOWIC1010
Table/Head speed: 121/120 rpm
Polishing pressure: 300 g/cm2
Slurry feed rate: 100 ml/min
Thin film measuring equipment: ST 5000 manufactured by K-MAC Test Example The physical properties of the slurry compositions for polishing prepared in Examples 1 to 3 and Comparative Examples 1 to 3 were measured by the following methods, and results are shown in Tables 3 and 4 below.
Polishing speed in high stepped regions: Measurement of oxide thin film thickness with an XP-300 plus profiler, and an ST 5000 manufactured by K-MAC.
Polishing speed in low stepped region: Measurement of oxide thin film thickness with an ST 5000 manufactured by K-MAC.
Remaining steps: Measurement of oxide thin film thickness with an ST 5000 manufactured by K-MAC.
Degree of flatness: Measurement of the degree of flatness using an ST 5000 manufactured by K-MAC after confirming whether the steps were removed using an XP-300 plus profiler.

[P1 Process]

TABLE 3

| | Removal rate of step [Å/min] | Removal amount of field oxide [Å/min] | Remaining step [Å] |
| --- | --- | --- | --- |
| Example 1 | 11,154 | 32 | 4,846 |
| Example 2 | 10,415 | 12 | 5,585 |
| Example 3 | 10,121 | 9 | 5,879 |
| XComparative Example 1 | 10,154 | 114 | 5,846 |
| Comparative Example 2 | 10,846 | 126 | 5,154 |
| Comparative Example 3 | 10,154 | 254 | 5,846 |

[P2 Process]

TABLE 4

| | Polishing time | Removal amount of field oxide [Å/min] | Remaining step [Å] | Degree of flatness [Å] |
| --- | --- | --- | --- | --- |
| Example 1 | 60 sec | 332 | 0 | within 50 |
| Example 2 | 60 sec | 412 | 0 | within 50 |
| Example 3 | 60 sec | 429 | 0 | within 50 |
| Comparative Example 1 | 60 sec | 814 | 0 | within 50 |
| Comparative Example 2 | 60 sec | 843 | 0 | within 50 |
| Comparative Example 3 | 60 sec | 1,025 | 0 | within 50 |

As shown in Table 3, it could be confirmed that when polishing with the slurry composition for polishing of the present invention (Examples 1 to 3), the high stepped regions had a high polishing speed and the low stepped regions had a low polishing speed as compared with Comparative Examples 1 to 3.

Further, as shown in Table 4, it was confirmed when polishing with the slurry composition for polishing of the present invention (Examples 1 to 3), all the remaining steps were removed while protecting the insulating oxide layer (field oxide) as compared with Comparative Examples 1 to 3.

FIG. 1 schematically shows a polishing process of a semiconductor thin film with steps of a high aspect ratio using a slurry composition for polishing of the present invention.

As shown in FIG. 1 below, it could be confirmed that when the polishing process was performed twice (P1 and P2 processes) using the slurry composition for polishing of the present invention, in the P1 process, the high stepped regions were rapidly polished with a high removal rate of the step while the low stepped regions were protected with a low removal amount of the insulating oxide layer (field oxide), and in the P2 process, all the remaining steps were removed while protecting the low stepped region to obtain a high degree of flatness.

According to the present invention, a slurry composition for polishing is provided that has a high polishing speed in high stepped regions while simultaneously protecting low stepped regions to obtain a high degree of flatness without leaving remaining steps after the completion of polishing, and a method is provided for polishing semiconductor thin films with steps of a high aspect ratio.

What is claimed is:

1. A slurry composition for polishing, comprising:
   a) polishing particle dispersion at a concentration of 3 to 5 wt %, pH of 8 to 9; and
   b) an additive mixture solution at a concentration of 0.3 to 1.5 wt %, pH of 5 to 7;
   wherein the additive mixture solution of b) includes a compound represented by Chemical Formula 1 below and a compound represented by Chemical Formula 2 below:

[Chemical Formula 1]

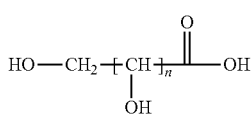

in Chemical Formula 1, n is an integer of 1 to 10,

[Chemical Formula 2]

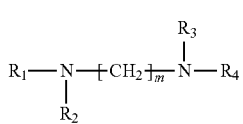

in Chemical Formula 2, $R_1$ to $R_4$ are independently C1-C10 alkyl groups, and m is an integer of 1 to 10.

2. The slurry composition for polishing of claim 1, wherein the a) polishing particles are cerium oxide particles.

3. The slurry composition for polishing of claim 1, wherein the a) polishing particles are included in an amount of 0.1 to 10 wt %.

4. The slurry composition for polishing of claim 1, wherein in Chemical Formula 1, n is 3 to 5.

5. The slurry composition for polishing of claim 1, wherein the b) compound represented by Chemical Formula 1 is included in an amount of 0.01 to 1 wt %.

6. The slurry composition for polishing of claim 1, wherein in Chemical Formula 2, m is from 2 to 4.

7. The slurry composition for polishing of claim 1, wherein the c) compound represented by Chemical Formula 2 is included in an amount of 0.01 to 1 wt %.

8. The slurry composition for polishing of claim 1, wherein a weight ratio of the b) compound represented by Chemical Formula 1 and the c) compound represented by Chemical Formula 2 is from 10:1 to 1:10.

9. The slurry composition for polishing of claim 1, wherein a surface charge of the slurry composition for polishing is a negative charge.

10. The slurry composition for polishing of claim 1, further comprising:
    an anionic polymer.

11. The slurry composition for polishing of claim 1, wherein the slurry composition for polishing is used to polish a film on a semiconductor substrate comprising 32 or more layers.

12. The slurry composition for polishing of claim 1, wherein a volume ratio of the a) polishing particle dispersion and the additive mixture solution of b) is from 1:1 to 1:10.

13. A method for polishing a film using the slurry composition for polishing of claim 1, the method comprising:
    primary-polishing with a slurry composition for polishing in which a volume ratio of the a) polishing particle dispersion and the b) additive mixture solution is from 1:1 to 1:3; and
    secondary-polishing with a slurry composition for polishing in which a volume ratio of the a) polishing particle dispersion and the b) additive mixture solution is from 1:4 to 1:10.

* * * * *